United States Patent
Spick et al.

(10) Patent No.: US 10,879,897 B2
(45) Date of Patent: Dec. 29, 2020

(54) METHOD FOR DETERMINING STRAY CONTACTS ON AN APPROACH AND/OR CONTACT DETECTION SENSOR, AND ASSOCIATED DETERMINATION DEVICE

(71) Applicants: Continental Automotive France, Toulouse (FR); Continental Automotive GmbH, Hannover (DE)

(72) Inventors: Gabriel Spick, Toulouse (FR); Olivier Elie, Plaisance du Touch (FR)

(73) Assignees: Continental Automotive France; Continental Automotive GmbH

( * ) Notice: Subject to any disclaimer, the term of this patent is extended or adjusted under 35 U.S.C. 154(b) by 0 days.

(21) Appl. No.: 16/481,913

(22) PCT Filed: Feb. 9, 2018

(86) PCT No.: PCT/FR2018/050321
§ 371 (c)(1),
(2) Date: Jul. 30, 2019

(87) PCT Pub. No.: WO2018/154210
PCT Pub. Date: Aug. 30, 2018

(65) Prior Publication Data
US 2020/0252064 A1    Aug. 6, 2020

(30) Foreign Application Priority Data
Feb. 23, 2017  (FR) .................................... 17 51421

(51) Int. Cl.
*H03K 17/96*    (2006.01)
*E05B 81/76*    (2014.01)

(52) U.S. Cl.
CPC ........... *H03K 17/962* (2013.01); *E05B 81/76* (2013.01); *H03K 2217/960705* (2013.01)

(58) Field of Classification Search
CPC ...... H03K 17/962; H03K 2217/960705; E05B 81/76; E05B 81/77; G07C 2209/65; G07C 9/00174
(Continued)

(56) References Cited

U.S. PATENT DOCUMENTS

2013/0060431 A1* 3/2013 Werner ................... E05B 85/01
                                                        701/49
2013/0194069 A1   8/2013 Baudru et al.
(Continued)

FOREIGN PATENT DOCUMENTS

WO        2012031654 A1     3/2012

OTHER PUBLICATIONS

English Translation of the Written Opinion for International Application No. PCT/FR2018/050321, dated May 4, 2018, 6 pages.
(Continued)

*Primary Examiner* — Vernal U Brown
(74) *Attorney, Agent, or Firm* — RatnerPrestia

(57) ABSTRACT

A method for detecting stray contacts on at least one approach or contact sensor integrated into a door handle, the handle including two electrodes whose capacitances are measured, a locking electrode, an unlocking electrode, the method includes detecting simultaneity in the crossing of the noise tolerance limits by the two capacitance value signals, and then in detecting the presence, on at least one signal, of a peak having a predetermined amplitude, the simultaneity and the peak being representative of stray contact on at least one of the electrodes.

7 Claims, 5 Drawing Sheets

(58) Field of Classification Search
USPC .......................................................... 340/5.7
See application file for complete search history.

(56) References Cited

U.S. PATENT DOCUMENTS

2014/0210257 A1    7/2014  Buttolo et al.
2019/0010735 A1*   1/2019  Kanematsu ............. E05B 81/76

OTHER PUBLICATIONS

International Search Report and Written Opinion for International Application No. PCT/FR2018/050321, dated May 4, 2018—8 pages.

* cited by examiner

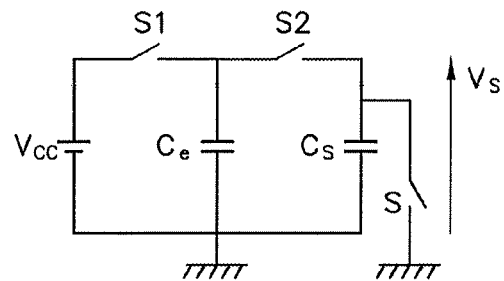
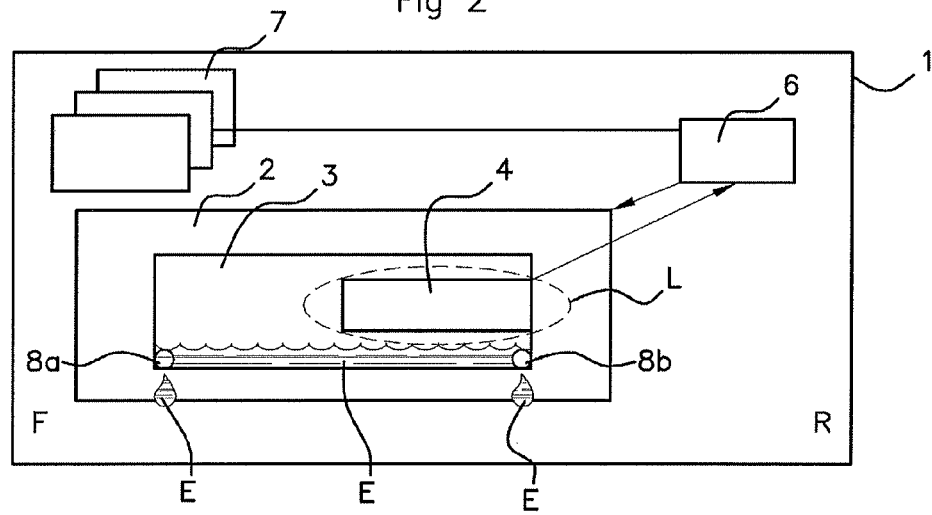
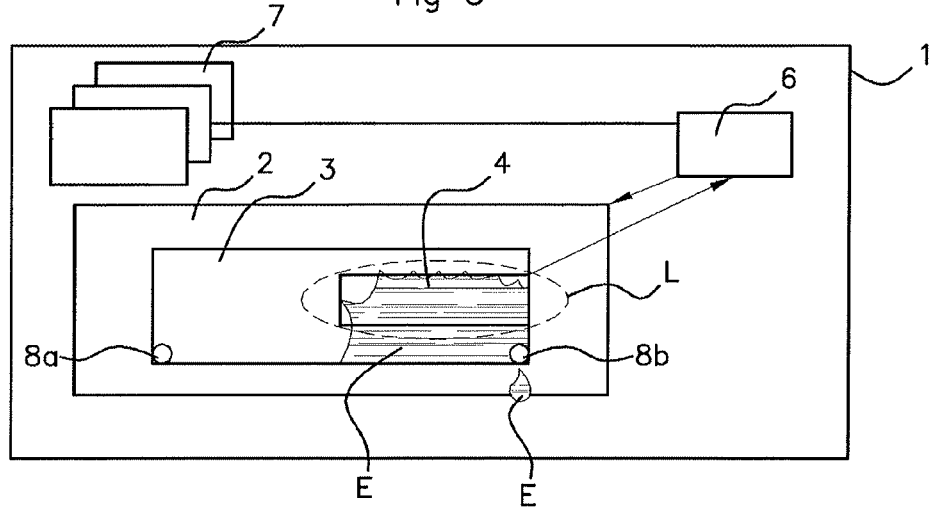

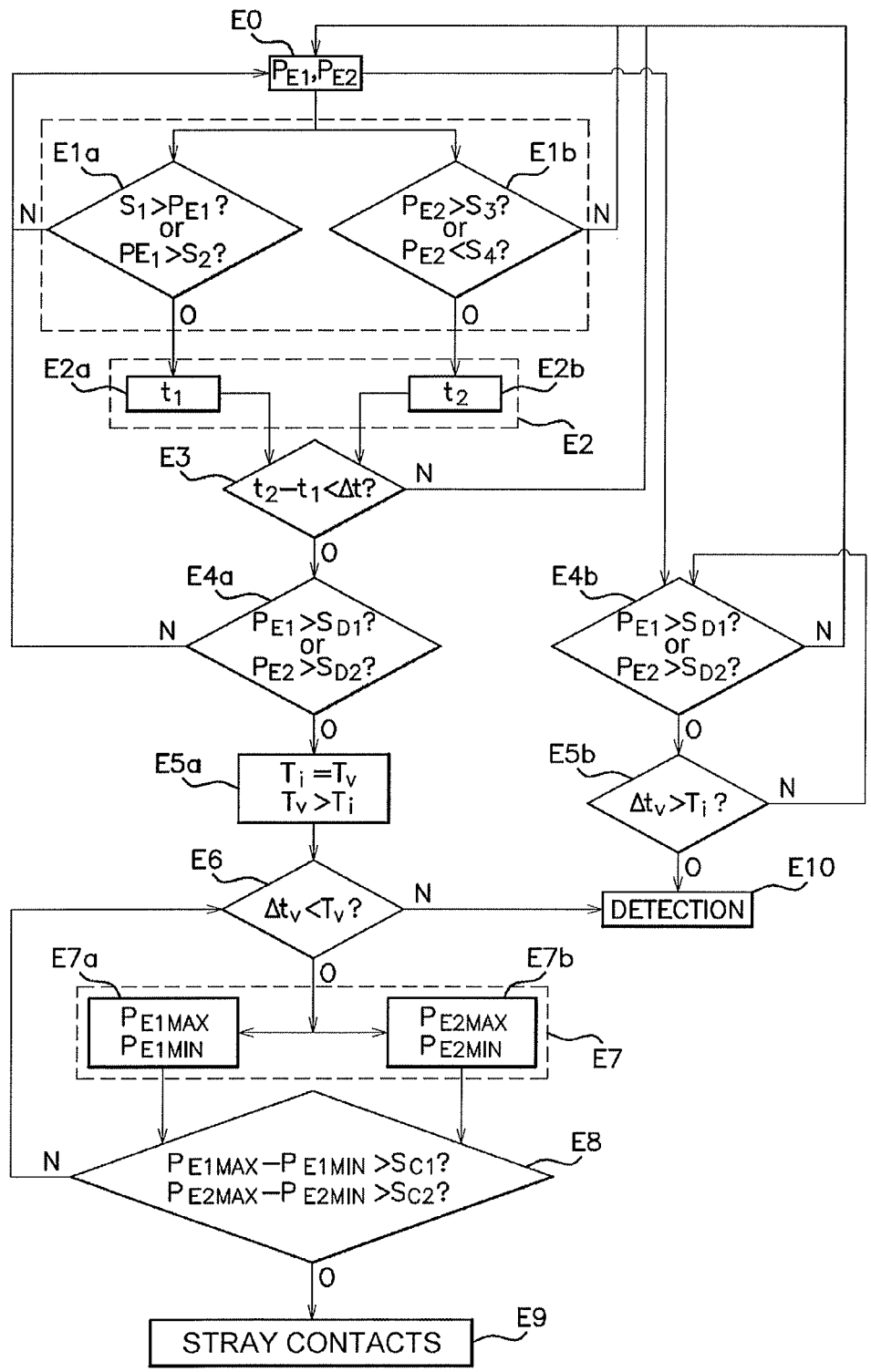

METHOD FOR DETERMINING STRAY CONTACTS ON AN APPROACH AND/OR CONTACT DETECTION SENSOR, AND ASSOCIATED DETERMINATION DEVICE

CROSS REFERENCE TO RELATED APPLICATIONS

This application is the U.S. National Phase Application of PCT International Application No. PCT/FR2018/050321, filed Feb. 9, 2018, which claims priority to French Patent Application No. 1751421, filed Feb. 23, 2017, the contents of such applications being incorporated by reference herein.

FIELD OF THE INVENTION

The present invention relates to a method for determining stray contacts on a door handle contact detection sensor. The invention applies in this case to the automotive sector.

BACKGROUND OF THE INVENTION

Nowadays, vehicle door handles are equipped with capacitive sensors for detecting approach and/or contact of a user. The detection of approach and/or contact of a user, coupled with the recognition of a "hands-free" electronic fob for remote access control carried by said user, allows the remote locking and unlocking of the opening elements of the vehicle. Thus, when the user, carrying the corresponding electronic fob identified by the vehicle, touches the door handle of his vehicle, the opening elements of the vehicle are automatically unlocked. By pressing on a precise location of the vehicle door handle, called the "unlocking zone", the door opens without needing to unlock it manually. Conversely, when the user, still carrying the necessary fob identified by the vehicle, wishes to lock his vehicle, he closes the door of his vehicle and he presses momentarily on another precise location of the handle, called the "locking zone". This movement makes it possible to lock the opening elements of the vehicle automatically.

Such systems for locking or unlocking the opening elements of the vehicle through simple contact of the user on specific zones of the door handle operate as follows:

The capacitive sensors, more often than not integrated into the door handle on the driver's side of a vehicle in the precise locking and unlocking zones, operate by counting the number of charge transfers N from a detection capacitor $C_e$, in this case a detection electrode, to a storage capacitor $C_s$ having a far higher capacitance (cf. FIG. 1). By way of a supply voltage $V_{CC}$ and two switches S1 and S2, the detection electrode $C_e$ charges and then discharges into the storage capacitor $C_s$ until a voltage threshold value Vs across the terminals of the storage capacitor $C_s$ is reached. This method for measuring the variation in the detection capacitance is known to a person skilled in the art and is given only by way of illustration; there are also other methods for measuring said variation.

When a user touches these zones, that is to say when he approaches either the locking electrode or the unlocking electrode, the contact of his hand increases the value of the capacitance of the detection electrode $C_e$. This results in a far lower number of charge transfers N being required to reach the voltage threshold $V_s$ across the terminals of the storage capacitor $C_s$. The new value of the number of charge transfers N is compared with a threshold value $N_{th}$, and if it is below this value, then approach and/or contact detection is performed. As an alternative, approach and/or contact detection is performed when the value of the detection capacitance Ce or when the value of a parameter P representative of the value of the detection capacitance Ce moves above a threshold.

Methods for measuring the detection capacitance Ce or a parameter representative of said capacitance are known to a person skilled in the art and will not be described here.

The approach and/or contact detection information, here the contact detection information in this case, is then sent in the form of a signal to the on-board system of the vehicle controlling locking/unlocking, which then triggers locking or unlocking using the sensor that has measured the variation in the number of charge transfers.

The parameter P representative of the value of the detection capacitance Ce is therefore continuously compared with a threshold above which approach and/or contact detection is performed.

Since the detection capacitance Ce, outside of detection phases, varies substantially depending on ambient conditions (water, humidity, electromagnetic interference), the parameter P representative of said detection capacitance Ce is not a fixed value, and is determined from previous values of said parameter P that are measured outside of detection phases for a predetermined previous measurement duration, from which a tolerance ΔP is subtracted. This tolerance ΔP is predetermined and has been calibrated beforehand so as to allow fast and effective approach and/or contact detections.

For example, the parameter P is a sliding average of the last values of said parameter outside of a detection phase.

The drawback of these locking and unlocking systems through a simple press of the user on a precise zone of the handle is the occurrence of false contact and/or approach detections on the locking zone or on the unlocking zone without the user having pressed on the locking zone or on the unlocking zone.

This phenomenon occurs when water, in particular water of a certain density (salt water mixed with ice or melted snow) is introduced into the handle. This is illustrated in FIGS. 2 and 3. FIG. 2 shows a vehicle 1 with doors 2 (in this case the door situated on the driver's side on the vehicle) including a handle 3 equipped with a contact detection sensor 4. It also includes an on-board electronic locking/unlocking system 6, linked to the door 2 and to the detection sensor 4.

The detection sensor 4 defines the locking zone L around the handle 3.

The handle 3 also comprises a detection sensor defining an unlocking zone situated between the handle 3 and the door 2 (not illustrated in FIGS. 2 and 3).

The handle 3 is also equipped with drainage holes 8a and 8b for draining infiltrated water. When water E infiltrates into the handle 3, it stagnates in the lower part of the handle 3, as illustrated in FIG. 2, and then flows slowly through the drainage holes 8a and 8b provided for this purpose. When the user bangs violently on his door 2, the water E is projected onto the detection sensor 4 (cf. FIG. 3), that is to say that it is projected against the detection sensor 4 and triggers contact detection on the locking zone (or unlocking zone, as the case may be). This is illustrated in FIG. 4, at the time to, the parameter P, representative of the value of the capacitance Ce of the locking electrode, moves above the threshold SD1, which is the threshold for detecting intention to lock.

These false contact detections often occur. Specifically, for the purpose of reducing cost and to be able to change the detection sensor 4 easily without having to change the entire handle 3, most door 2 handles 3 are not waterproof.

In addition, the drainage holes 8*a* and 8*b* provided in order to drain the infiltrated water E do not drain the water fast enough, especially water of high density, specifically salt water mixed with ice. This type of water E is therefore able to remain for a sufficiently long time in the handle 3 on the detection sensor 4 and trigger false contact detections on one or the other of the (locking or unlocking) electrodes.

Thus, locking contact detection in the example illustrated in FIGS. 2 and 3 takes place without the user having requested it. The information regarding this contact detection on the locking zone L is then sent to the on-board electronic locking and unlocking system 6, which performs locking even though the user has not approached the detection sensor 4 and has not confirmed his intention to lock his vehicle 1.

SUMMARY OF THE INVENTION

The aim of an aspect of the present invention is therefore to propose a method for determining stray contacts on a door handle contact detection sensor, making it possible to distinguish between contact on the sensor stemming from a stray phenomenon, in this case due to the presence of water, and contact stemming from the user. The aim of this is to avoid any false locking or unlocking detection when the user bangs on a door.

An aspect of the invention proposes a method for determining stray contacts on at least one approach and/or contact detection sensor integrated into a vehicle door handle, said handle comprising a determination device comprising a locking electrode, an unlocking electrode, and a management unit, measuring values representative of the capacitances of said electrodes, the crossing of a respective detection threshold of a capacitance of the locking electrode or of a capacitance of the unlocking electrode for a predetermined detection duration confirming the approach detection, said method being noteworthy in that it furthermore comprises the following steps:

- Steps 1*a* and 1*b*: Comparing said measurements with predetermined noise thresholds, if said measurements cross their respective predetermined thresholds at a first time and respectively at a second time following the first time,
- Steps 2*a* and 2*b*: then storing the first and second time,
- Step 3: calculating a period between the first and second time and if said period is shorter than a predetermined duration, then
- Step E4*a*: if the value of the locking capacitance or if the capacitance of the unlocking electrode exceeds its respective detection threshold, then
- Step E5*a*: increasing the detection duration,
- Step E6: for as long as the new detection duration has not elapsed,
- Steps E7*a* and E7*b*: Determining the presence of a peak on each measured signal of the capacitances, and calculating an amplitude for each peak,
- Step E8: If at least one of the calculated amplitudes is greater than a predetermined threshold, then
- Step E9: Determining stray contacts.

An aspect of the invention also relates to a device for determining stray contacts on at least one approach and/or contact detection sensor, said device comprising:

a locking electrode,
an unlocking electrode, and
a management unit,
means for measuring values representative of the capacitances of said electrodes,
means for detecting the crossing of a respective detection threshold of a capacitance of the locking electrode or of a capacitance of the unlocking electrode for a predetermined detection duration in order to confirm the approach detection, said device being noteworthy in that it furthermore comprises:

first means for comparing between the value of the first capacitance and two thresholds, a first threshold and a second threshold,
second means for comparing between the value of the second capacitance and two thresholds, a third threshold and a fourth threshold,
first means for storing a first time representative of the crossing of the value of the first capacitance, either above the first threshold or below the second threshold,
second means for storing a second time representative of the crossing of the value of the second capacitance, either above the third threshold or below the fourth threshold,
third means for comparing between a period calculated between the second time and the first time and a predetermined duration,
means for increasing a detection duration on the basis of the results of the third comparison means,
first means for detecting a first value peak of the first capacitance and for storing a maximum value and a minimum value representative of said first peak,
second means for detecting a second value peak of the second capacitance and for storing a maximum value and a minimum value representative of said second peak,
fourth means for comparing between an amplitude of the first peak and a first predetermined value,
fifth means for comparing between an amplitude of the second peak and a second predetermined value,
means for confirming the detection of stray contacts on the basis of the results of the comparisons performed by the fourth and fifth comparison means,
a clock Advantageously, first comparison means, the second comparison means, the first storage means, the second storage means, the third comparison means, the first means for detecting a first value peak, the second means for detecting a second value peak, the fourth comparison means, the fifth comparison means; the confirmation means and the increasing means take the form of software integrated into the management unit.

An aspect of the invention also applies to any vehicle door handle and to any vehicle comprising a determination device according to any one of the features listed above.

BRIEF DESCRIPTION OF THE DRAWINGS

Other aims, features and advantages of aspects of the invention will become apparent on reading the following description, by way of nonlimiting example, and on examining the appended drawings, in which:

FIG. 1 shows a schematic view of a capacitive approach and/or contact detection sensor, and has already been explained, FIG. 2 shows a schematic view of water infiltration into a vehicle door handle equipped with an approach and/or contact detection sensor, and has been explained above, FIG. 3 shows a schematic view of the phenomenon of false contact detections due to the projection of the infiltrated water onto the approach and/or contact detection sensor when closing the door, and has already been explained above, FIG. 4, explained above, is a graph showing the value of the parameter P representative of the value of the locking detection capacitance when banging on a door, illustrating false locking detection, FIG. 8 shows the stray contact determination method according to an aspect of the invention.

DETAILED DESCRIPTION OF THE PREFERRED EMBODIMENTS

An aspect of the invention proposes a stray contact detection method and device D having the advantage of distinguishing between a false locking or unlocking detection due to the projection of residual water in the handle against the locking electrode and/or against the unlocking electrode and an authentic detection of intention to lock or to unlock from the user, through simple approach or contact of the user's hand close to the locking or unlocking electrode.

Figure 4:
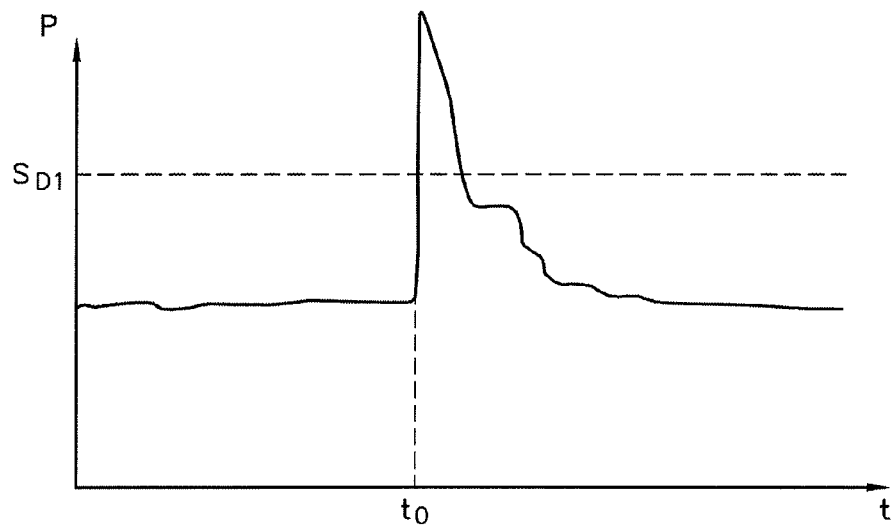
Figure 5:
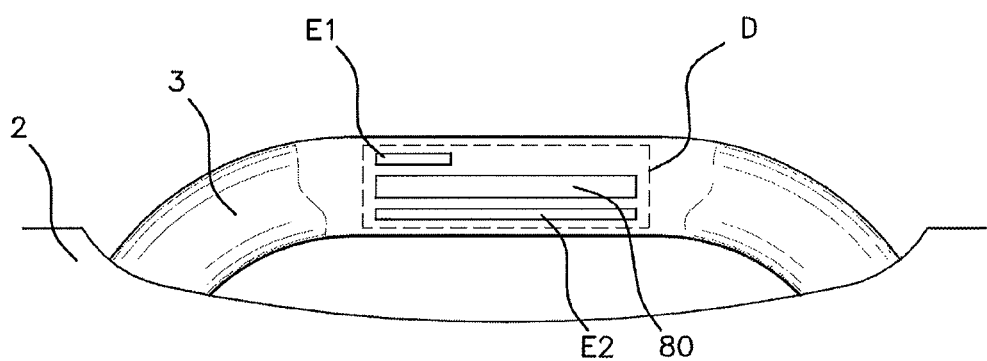
FIG. 5 shows the determination device according to an aspect of the invention, integrated into a vehicle door handle.

As illustrated in FIG. 5, the stray contact determination device D according to an aspect of the invention is integrated into a vehicle 1 door 2 handle 3 (vehicle 1 not shown in FIG. 5).

The determination device D comprises:
a locking electrode E1,
an unlocking electrode E2,
a management unit 80 for managing said electrodes E1, E2, for example in the form of a microcontroller contained in a printed circuit.

The management unit 80 comprises:
means M0a for measuring the value PE1 of the capacitance of the locking electrode E1 and the value PE2 of the capacitance of the unlocking electrode E2,
means M0b for detecting the crossing of the values of the capacitance of the locking electrode PE1 and the capacitance of the unlocking electrode PE2 above respective detection thresholds, a first detection threshold SD1, or respectively a second detection threshold SD2, I
a clock H or means for measuring a detection period Ti starting from said crossing.

In the prior art, if the capacitance of the locking electrode PE1 or the unlocking capacitance cross their respective detection threshold SD1, SD2, then the approach and/or contact detection is confirmed at the end of the detection period Ti.

This is known in the prior art and will not be described in more detail here.

According to an aspect of the invention, the determination device D furthermore comprises:
first means M1a for comparing between the value of the capacitance of the locking electrode PE1 and two thresholds, a first noise threshold S1 and a second noise threshold S2,
second means M1b for comparing between the value of the capacitance of the unlocking electrode PE2 and two thresholds, a third noise threshold S3 and a fourth noise threshold S4,
first means M2a for storing a first time t1 representative of the crossing of the value of the capacitance of the locking electrode PE1 either above the first threshold S1 or below the second threshold S2,
second means M2b for storing a second time t2 representative of the crossing of the value of the capacitance of the unlocking electrode PE2 either above the third threshold S3 or below the fourth threshold S4,
third means M3 for comparing between a period calculated between the second time t2 and the first time t1 and a predetermined duration $\Delta t$,
means M7 for increasing a detection period on the basis of the result of the comparison performed by the third comparison means M3,
a clock H,
first means M4a for detecting a first value peak of the capacitance of the locking electrode E1 and for storing a maximum value PE1MAX and a minimum value PE1MIN representative of said peak,
second means M4b for detecting a second value peak of the capacitance of the unlocking electrode E2 and for storing a maximum value PE2MAX and a minimum value PE2MIN representative of said peak,
fourth means M5a for comparing between an amplitude calculated from the minimum value PE1MIN and the maximum value PE1MAX thus stored with a first predetermined value Sc1,
fifth means M5b for comparing between an amplitude calculated from the minimum value PE2MIN and the maximum value PE2MAX thus stored with a second predetermined value Sc2,
means M6 for confirming the detection of stray contacts on the basis of the results of the comparisons performed by the fourth and fifth comparison means M5a, M5b.

A value peak is understood to mean a sudden and sharp increase in the signal followed by a sharp decrease, or a sudden and sharp decrease followed by a sharp increase, such that the peak exhibits two extrema (a minimum and a maximum). The amplitude of the peak corresponds to the difference between said maximum or minimum and the following minimum or maximum, respectively.

Figure 6:
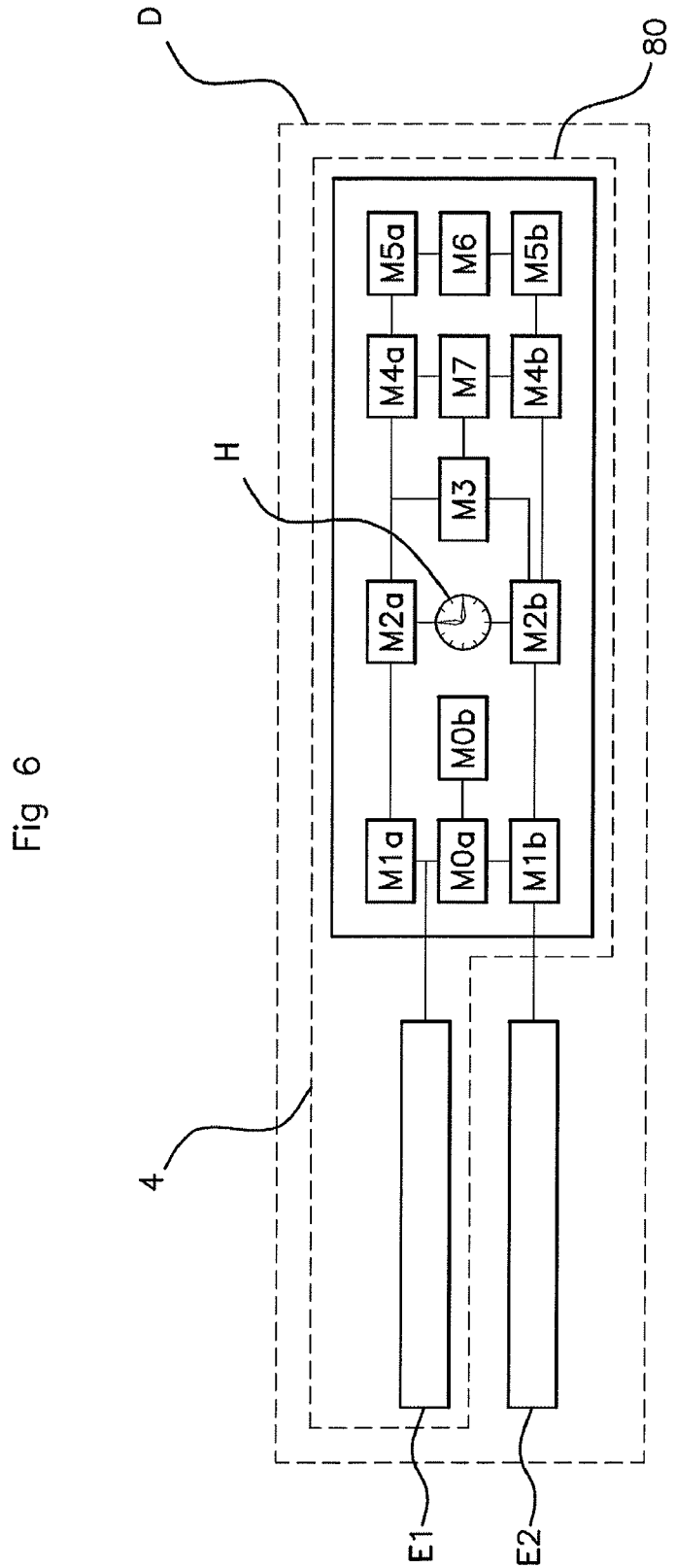
FIG. 6 shows the stray contact determination device according to an aspect of the invention.

The first comparison means M1a, the second comparison means M1b, the first storage means M2b, the second storage means M2b, the third comparison means M3, the first means M4a for detecting the first peak and for storing values representative of said peak, the second means M4b for detecting the second peak and for storing values representative of said peak, the fourth comparison means M5a, the fifth comparison means M5b, the confirmation means M6 and the means M7 for increasing the detection duration take the form of software integrated into the management unit 80. This is illustrated in FIG. 6.

The clock H is for example an electronic clock.

Figure 7:
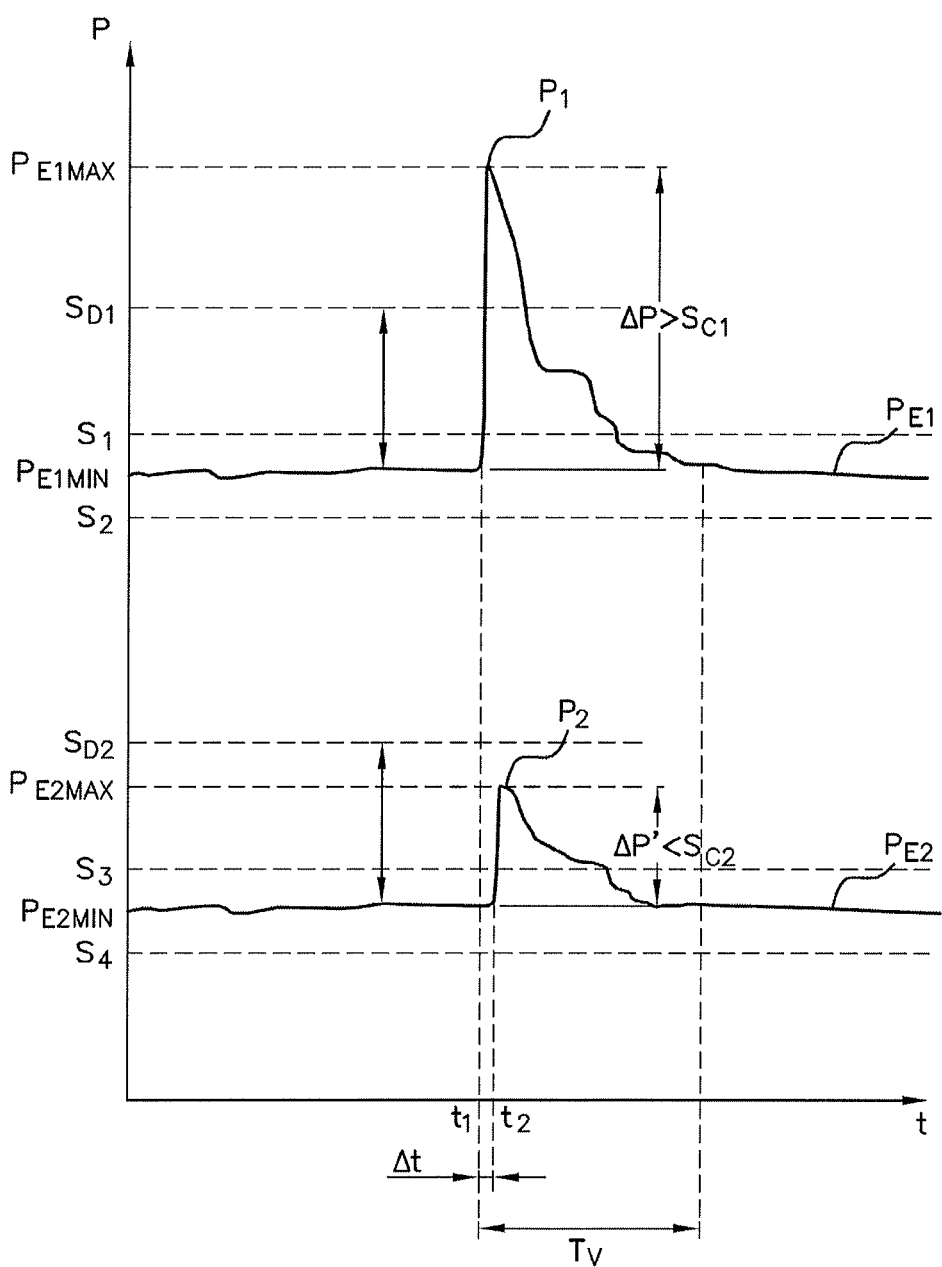
FIG. 7 is a graph showing the value of the parameter PE1 representative of the value of the locking detection capacitance and the value of the parameter PE2 representative of the value of the unlocking detection capacitance when banging on a door, according to an aspect of the invention.

The stray contact determination method is illustrated in FIGS. 7 and 8 and will now be described.

In an initial step, E0, the values of the capacitance of the locking electrode PE1, which will be called first capacitance PE1, and of the capacitance of the locking electrode PE2, which will be called second capacitance PE2, are measured continuously, at a predetermined measurement frequency.

In the detection method from the prior art, when either the first capacitance PE1 or the second capacitance PE2 is greater respectively than a first detection threshold SD1 or respectively than a second detection threshold SD2 (step E4b), and if a duration Δtv starting from said crossing of the values of the first or of the second capacitance PE1, PE2 above their respective threshold is greater than a predetermined detection duration Ti (step E5b), then the approach detection is confirmed (step E10).

As explained above, the crossing above the detection threshold SD1, SD2 of the values of the capacitances of the electrodes PE1, PE2 may also stem from a false detection due to the projection of water onto one or the other of the two electrodes.

The method according to an aspect of the invention makes it possible to overcome this drawback and is explained below:

In a first step E1, the value of the first capacitance E1 is compared with two thresholds, a first threshold S1 and a second threshold S2 (step E1a); these two thresholds represent the two upper and lower limits of a measurement tolerance window for the value of the first capacitance E1. The measurement tolerance window is justified by the presence of numerous external disruptions (electromagnetic interference, ambient temperature, etc.) impacting the value of the first capacitance E1.

At the same time, the value of the second capacitance E2 is compared with two other thresholds, a third threshold S3 and a fourth threshold S4 (step E1b); these two thresholds represent the two upper and lower limits of a measurement tolerance window for the value of the second capacitance E2, due to external disruptions (electromagnetic interference etc.). Likewise, the measurement of the value of the second capacitance E2 is compared with two limits of a measurement tolerance window.

In a second step E2, if at a first time t1:
the first capacitance E1 is greater than the first threshold S1, or
the first capacitance E1 is lower than the second threshold S2 (step E2a),
And if, at a second time t2, following the first time t1:
the second capacitance E2 is greater than the third threshold S3, or
the second capacitance E2 is lower than the fourth threshold S4 (step E2b),
Such that the period between the stored first time t1 and the stored second time t2 is shorter than a predetermined duration Δt, that is to say if (t2−t1)≤Δt (step E3), then the conditions below are satisfied.

In a fourth step (step E4a), if the first capacitance PE1 is greater than the first detection threshold SD1 or if the second capacitance PE2 is greater than the second detection threshold SD2, then the detection duration Ti is increased, and is equal to a new detection duration Tv (step E5a).

For as long as the duration Δtv starting from the crossing either of the first capacitance PE1 above the first threshold SD1 or of the second capacitance PE2 above the second threshold SD2 is shorter than the new detection duration Tv (step E6), then the presence of a first value peak P1 is confirmed (step E1a) and a maximum value PE1MAX and a minimum value PE1MIN of the first capacitance PE1 representative of said peak are stored, and the presence of a second value peak P2 is also confirmed in parallel (step E7b) and a maximum value PE2MAX and a minimum value PE2MIN of the second capacitance PE2 representative of said peak are stored.

In an eighth step, the difference between the maximum value PE1MAX and the minimum value PE1MIN of the first capacitance PE1, that is to say the amplitude of the first peak P1, is compared (step E8) with a first predetermined value Sc1, and similarly, the difference between the maximum value PE2MAX and the minimum value PE2MIN of the second capacitance PE2, that is to say the amplitude of the second peak P2, is compared with a second predetermined value Sc2.

If the amplitude thus calculated of the first peak P1 or if the amplitude thus calculated of the second peak P2 is greater respectively than the first predetermined value Sc1 or greater respectively than the second predetermined value Sc2 (step E5), that is to say if (PE1MAX−PE1MIN)>Sc1 or if (PE2MAX−PE2MIN)>Sc2) and if the new detection duration Tv has elapsed, then in step E9, the determination of stray contacts is confirmed.

Otherwise, if the calculated amplitudes are smaller than the respective predetermined values and if the new detection duration Tv has elapsed, then this means that there is no presence of a peak on at least one of the two signals representative of a false detection (i.e.: of a stray detection), and authentic detection is confirmed (step E10).

The stray contact determination according to an aspect of the invention is therefore based on two criteria:
the virtual simultaneity of crossing of the capacitance values of the two electrodes, the first capacitance PE1 and the second capacitance PE2 (locking, unlocking) outside of their measurement tolerance window (S1, S2 and S3, S4, noise tolerance), and
the presence, in a given time, that is to say during a new detection duration Tv, at least on one of the measured signals of capacitance of the two electrodes PE1, PE2, of a value peak, that is to say a sharp increase followed by a sharp decrease (or vice versa) greater than a predetermined threshold.

Specifically, the applicant has established, in contrast to the prior art, that when banging on a door:
the infiltrated water in the handle 3 moved inside the handle 3 and impacted the two electrodes E1, E2 virtually simultaneously, and
the impact of the projected water on each of the measured signals of the capacitances was different but able to be characterized, and took the form of a sudden peak, limited in terms of time, of values of the capacitances PE1, PE2, having a predetermined amplitude,
and
said peak was present on at least one of the two measured signals of capacitance PE1, PE2 of the electrodes.

In the prior art, as soon as the first or second capacitance PE1, PE2 exceeds the first or respectively the second detection threshold SD1, SD2, the approach detection is confirmed at the end of the detection duration Ti.

Now, the applicant has established that the detection duration Ti was insufficient for detecting stray contact.

In contrast to the prior art, an aspect of the invention therefore proposes, as soon as simultaneity in the crossings of the capacitance values of two electrodes outside of their measurement tolerance is detected, to extend the detection duration so as to determine the presence of a peak of an amplitude greater than a predetermined value Sc1, Sc2 on one or the other of the signals of values of the capacitances of the electrodes PE1, PE2, said peak signifying a false detection.

This is illustrated in FIG. 7.

The graph illustrated in FIG. 7 shows the two measured signals of the capacitance value of the two electrodes PE1, PE2. The signal of the value of the first capacitance PE1 is shown at the top of the graph, and the signal of the value of the second capacitance PE2 is shown at the bottom of the graph 7.

At the first time t1, the value of the first capacitance PE1 exceeds the first threshold S1.

At the second time t2, following the first time t1 and spaced from the first time by a duration shorter than the predetermined duration Δt, the value of the second capacitance PE2 also crosses the third threshold S3.

The signal representative of the first capacitance PE1 exceeds the first detection threshold SD1, and a new detection duration Tv is applied. The signal of the first capacitance PE1 then exhibits a sharp increase followed by a sharp decrease, that is to say a first peak P1.

The amplitude of the signal, that is to say the difference between the maximum value PE1MAX and the minimum value PE1MIN, that is to say ΔP, measured during the new detection duration Tv, is greater than the first threshold Sc1.

The stray contact determination is therefore confirmed, even though the signal representative of the capacitance of the second electrode PE2 has not exceeded the second detection threshold SD2 and also exhibits a second peak P2, the amplitude ΔP' (PE2MAX−PE2MIN) of which however is not greater than the second threshold Sc2.

As the detection is a false detection, the information sent to the management unit 80 does not trigger any unlocking or locking.

An aspect of the invention is therefore expedient and inexpensive by virtue of the monitoring of the signals of the two electrodes and, by virtue of the calculating software means, the method of an aspect of the invention makes it possible to reliably determine false detections due to the projection of water onto the electrodes when banging on a door.

The invention claimed is:

1. A method for determining stray contacts on at least one approach and/or contact detection sensor integrated into a vehicle door handle, said handle comprising a determination device comprising a locking electrode, an unlocking electrode, and a management unit, measuring values representative of the capacitances of said electrodes, the crossing of a respective detection threshold of a capacitance of the locking electrode or of a capacitance of the unlocking electrode for a predetermined detection duration confirming the approach detection, said method comprising:

Steps 1*a* and 1*b*: Comparing said measurements with predetermined noise thresholds, if said measurements cross their respective predetermined thresholds at a first time and respectively at a second time following the first time, Steps 2*a* and 2*b*: then storing the first and second time, Step 3; calculating a period between the first and second time and if said period is shorter than a predetermined duration, then proceed to Step E4*a*, otherwise proceed to Steps 1*a* and 1*b*, Step E4*a*: if the value of the locking capacitance or if the capacitance of the unlocking electrode exceeds its respective detection threshold, then proceed to step E5*a*, otherwise proceed to Steps 1*a* and 1*b*, Step E5*a*: increasing the detection duration, Step E6: for as long as the new detection duration has not elapsed, Steps E7*a* and E7*b*: Determining the presence of a peak on each measured signal of the capacitances, and calculating an amplitude for each peak, Step E8: If at least one of the calculated amplitudes is greater than a predetermined threshold, then a stray contact is confirmed as detected, otherwise proceed to step E6.

2. A device for determining stray contacts on at least one approach and/or contact detection sensor, said device comprising:

a locking electrode, an unlocking electrode, and a management unit, means for measuring values representative of the capacitances of said electrodes, means for detecting the crossing of a respective detection threshold of a capacitance of the locking electrode or of a capacitance of the unlocking electrode for a predetermined detection duration in order to confirm the approach detection, first means for comparing between the value of the first capacitance and two thresholds, a first threshold and a second threshold, second means for comparing between the value of the second capacitance and two thresholds, a third threshold and a fourth threshold, first means for storing a first time representative of the crossing of the value of the first capacitance, either above the first threshold or below the second threshold, second means for storing a second time representative of the crossing of the value of the second capacitance, either above the third threshold or below the fourth threshold, third means for comparing between a period calculated between the second time and the first time and a predetermined duration, means for increasing a detection duration on the basis of the results of the third comparison means, first means for detecting a first value peak of the first capacitance and for storing a maximum value and a minimum value representative of said first peak, second means for detecting a second value peak of the second capacitance and for storing a maximum value and a minimum value representative of said second peak, fourth means for comparing between an amplitude of the first peak and a first predetermined value, fifth means for comparing between an amplitude of the second peak and a second predetermined value, means for confirming the detection of stray contacts on the basis of the results of the comparisons performed by the fourth and fifth comparison means, and a clock.

3. The determination device as claimed in claim 2, wherein the first comparison means, the second comparison means, the first storage means, the second storage means, the third comparison means, the first means for detecting a first value peak, the second means for detecting a second value peak, the fourth comparison means, the fifth comparison means; the confirmation means and the increasing means take the form of software integrated into the management unit.

4. A vehicle door handle, comprising a determination device as claimed in claim 3.

5. A motor vehicle, comprising a determination device as claimed in claim 3.

6. A vehicle door handle, comprising a determination device as claimed in claim 2.

7. A motor vehicle, comprising a determination device as claimed in claim 2.

* * * * *